United States Patent [19]

Hoover

[11] 4,353,036

[45] Oct. 5, 1982

[54] FIELD EFFECT TRANSISTOR AMPLIFIER WITH VARIABLE GAIN CONTROL

[75] Inventor: Merle V. Hoover, Flemington, N.J.

[73] Assignee: RCA Corporation, New York, N.Y.

[21] Appl. No.: 182,787

[22] Filed: Aug. 29, 1980

[51] Int. Cl.[3] .......................... H03F 3/30; H03G 3/30
[52] U.S. Cl. .................................. 330/264; 330/277; 330/285; 330/123
[58] Field of Search ............... 330/264, 277, 285, 123

[56] References Cited

U.S. PATENT DOCUMENTS

| | | | |
|---|---|---|---|
| 3,260,948 | 7/1966 | Theriault | 330/285 X |
| 3,543,175 | 11/1970 | Prout et al. | 330/285 X |
| 3,887,881 | 6/1975 | Hoffmann | 331/116 R X |
| 4,038,607 | 7/1977 | Schade, Jr. | 330/264 |
| 4,092,612 | 5/1978 | Schade, Jr. | 330/264 X |

Primary Examiner—James B. Mullins
Attorney, Agent, or Firm—Eugene M. Whitacre; Paul J. Rasmussen; Allan J. Jacobson

[57] ABSTRACT

A complementary symmetry amplifier having variable gain control is used in an automatic gain control (AGC) system. The amplifier includes first and second field effect transistors of opposite conductivity type. Variable gain control is achieved by applying first and second differential control signals to respective gate electrodes of said first and second field effect transistors.

11 Claims, 4 Drawing Figures

FIELD EFFECT TRANSISTOR AMPLIFIER WITH VARIABLE GAIN CONTROL

FIELD OF THE INVENTION

This invention pertains to complementary symmetry amplifiers with variable gain control.

Amplifiers with controllable gain are useful in automatic gain control (AGC) systems. For example, in radio and TV receivers, the signal output of the radio frequency (RF) stages and/or the intermediate frequency (IF) stages of the receiver is maintained at a given level even though the signal strength at the receiver input may be varying.

In a receiver, for example, automatic gain control is achieved by detecting the average value of the IF signal and using such detected signal to control the gain of the RF stage. The gain of the RF stage is increased for decreasing IF signal strength, and vice versa, so as to maintain substantially invariant signal strength at the IF output.

It is desired to use complementary symmetry metal oxide semiconductors (CMOS) transistors in RF and IF amplifier circuits. Such CMOS circuits are attractive because of their exceptionally high input impedance (e.g. megohms), square law transfer characteristics which result in low cross modulation products, and wide dynamic operating range. The present invention concerns a gain control arrangement which enables CMOS circuits to be advantageously used in AGC systems.

SUMMARY OF THE INVENTION

The present invention is embodied in a CMOS amplifier comprising first and second field effect transistors of opposite conductivity types, wherein the drain electrodes thereof are connected to an output terminal, and the respective source electrodes thereof are connected to terminals for receiving operating and reference potentials respectively. The input of the CMOS amplifier is coupled to an input terminal. Variable gain control of the amplifier is obtained by means for applying a balanced differential control signal between the respective gate electrodes of the first and second field effect transistors.

DETAILED DESCRIPTION

Figure 1:
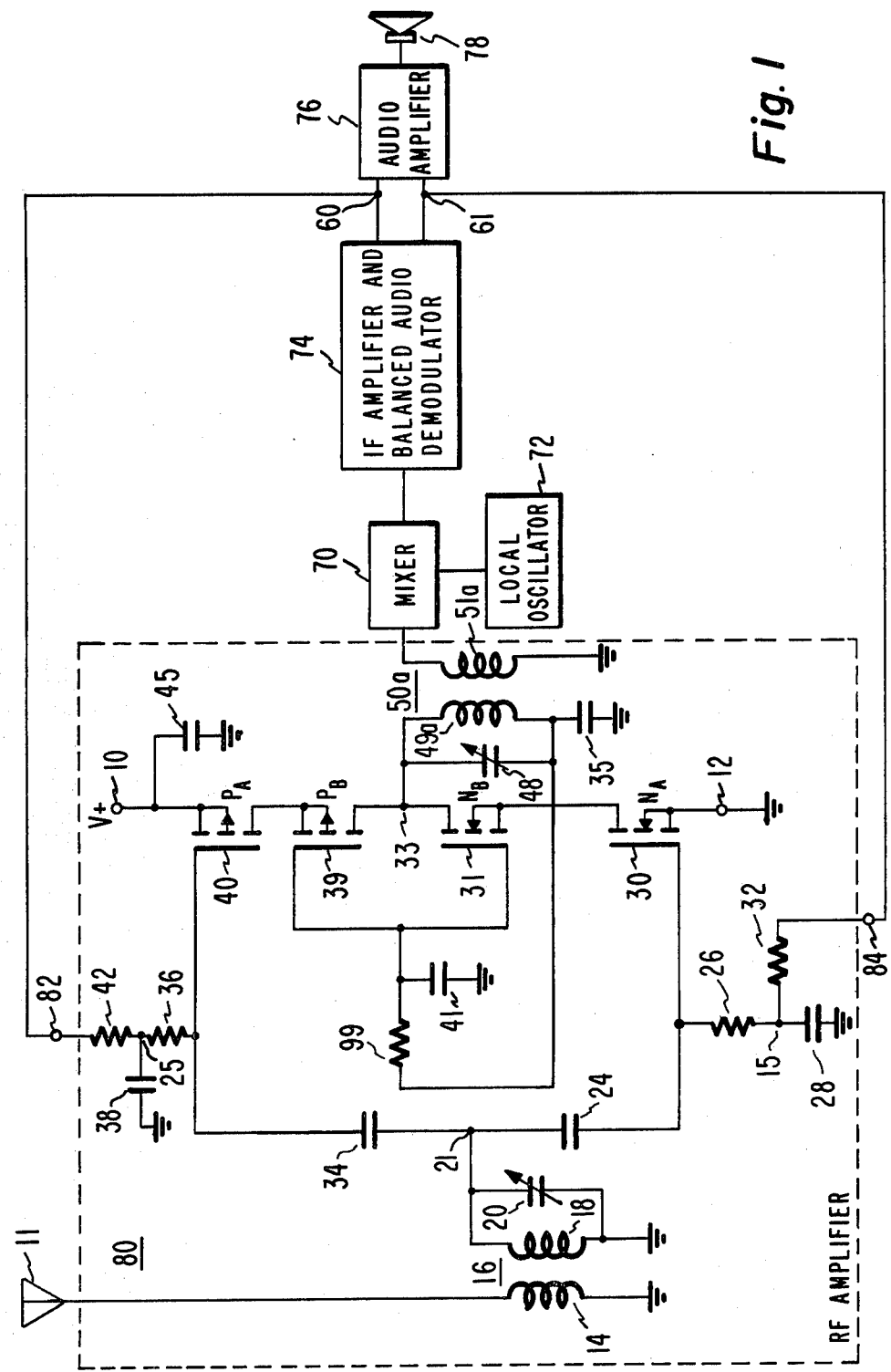
FIG. 1 is a schematic diagram, partially in block form, illustrating a use of the present invention for automatic gain control in a radio receiver.

FIG. 1 illustrates a conventional radio receiver arrangement for heterodyning a received RF signal to produce an IF signal, and demodulating the IF signal to produce an audio signal. Specifically, an antenna 11 is connected to an RF amplifier 80, the output of which is connected to one input of a mixer 70. The other input to the mixer 70 is provided by local oscillator 72 to produce an IF signal to IF amplifier 74. The IF amplifier 74 includes a balanced demodulator which provides a balanced differential audio output at terminals 60 and 61. An audio amplifier 76, responsive to the differential signal between terminals 60 and 64, drives a loudspeaker 78.

The RF amplifier 80 comprises two P channel transistors $P_A$ and $P_B$, and two N-channel transistors $N_A$ and $N_B$, arranged in complementary cascode configuration. Transistors $P_A$ and $N_A$ are operated as complementary common-source amplifiers with respective source electrodes connected to terminals 10 and 12 respectively, which terminals receive respective operating and reference potentials, in this case, V+ and ground. Transistors $P_B$ and $N_B$ are operated as complementary common-gate amplifiers with their respective drain electrodes connected to circuit node 33, and their respective source electrodes connected to the respective drain electrodes of transistors $P_A$ and $N_A$.

The complementary cascode arrangement used in FIG. 1 reduces the feedback resulting from gate-to-drain capacitance. Such effect, which is known as the Miller effect, tends to cause the amplifier to oscillate at high frequencies. Transistors $P_B$ and $N_B$ act as impedance transformers which reduce the voltage swing at the collector electrodes of $P_A$ and $N_A$, respectively, to reduce the Miller effect. Cascode circuit arrangements are suitable for relatively higher frequency applications such as the RF amplifier 80 illustrated in FIG. 1.

The input signal to RF amplifier 80 from antenna 11 is coupled to the gate electrodes of $P_A$ and $N_A$ through transformer 16, and capacitors 24 and 34. The secondary winding 18 of transformer 16 and tunable capacitor 20 (which like local oscillator 72 may be tuned in response to a tuning voltage set in accordance with the selected station) are connected to circuit node 21 to form a parallel resonant circuit at the received signal frequency. Circuit node 21 is further coupled to the gate electrodes of transistors $P_A$ and $N_A$ through capacitors 34 and 24, respectively.

The RF signal at node 33 is coupled to mixer 70 through transformer 50a. The primary winding 49a of transformer 50a and tunable capacitor 48 form a resonant load for the RF amplifier at the received signal frequency. Capacitor 45 is an RF bypass capacitor used to decouple the RF signal from the V+ power supply. Transistors $P_B$ and $N_B$ are biased to the midpoint of their linear operating range by a feedback path comprising the resistor 99 connected between respective gate and drain electrodes of transistors $P_B$ and $N_B$ via the primary winding 49a of transformers 50a. Capacitors 41 and 35 present a low impedance path for RF signal frequencies, particularly for those signals in the range of the received signal frequency.

In operation, transistors $P_A$ and $N_A$ provide signal amplification. When the input signal potential at node 21 becomes more positive, the conductivity of transistor $P_A$ decreases and the conductivity of $N_A$ increases, so that the potential at node 33 decreases. When the input signal potential at node 21 becomes more negative, the conductivity of transistor $P_A$ increases and the conductivity of $N_A$ decreases, so that the potential at node 33 increases.

The gain of RF amplifier 80 is controlled by the signals from IF amplifier 74 applied at respective terminals 82 and 84, which signals also determine the quiescent operating point. For example, if the respective signals on terminals 82 and 84 are V+ and ground, then $P_A$ and $N_A$ are cutoff, providing zero gain. As the potential on terminal 82 is decreased from V+ by more than one threshold voltage of transistor $P_A$, that transistor begins to conduct. As the potential on terminal 82 is decreased further, the transconductance of $P_A$ is increased, thereby increasing the voltage gain of transistor $P_A$. As the potential on terminal 84 is increased from ground potential by more than one threshold voltage of transistor $N_A$, that transistor begins to conduct. As the potential on terminal 84 is increased further, the transconductance of $N_A$ is increased, thereby increasing the voltage gain of transistor $N_A$.

Preferably, the AGC control signals on terminals 82 and 84 should be varied in a balanced differential fashion so as to maintain a stable quiescent operating point for RF amplifier 80 as its gain is varied. Note that the input signal is coupled to the gate electrodes of $P_A$ and $N_A$ via capacitors 24 and 34 which provide dc isolation, so that the dc potential at respective gate electrodes is essentially determined by the potentials applied at terminals 82 and 84. Alternatively, the input signal may be coupled to the gate electrodes of $P_A$ and $P_B$ by separate respective secondary windings of transformer 16 so as to provide dc isolation between such gate electrodes.

The average value of the balanced differential audio output between terminals 60 and 61 is representative of the signal strength of the IF signal. Terminals 60 and 61 are also connected to terminals 82 and 84, respectivey, so that the balanced differential audio signals on terminals 60 and 61 are used to control the gain of RF amplifiers 80. However, the signals at terminals 60 and 61 are filtered to obtain their respective dc value before application to terminals 82 and 84. Towards this end, resistors 42, 36, and capacitor 38 form a low pass filter between terminal 82 and the gate electrode of transistor $P_A$, and resistors 32 and 26, and capacitor 28 form a low pass filter between terminal 84 and the gate electrode of transistor $N_A$. The audio modulation on terminals 60 and 61 is thus filtered out so that such audio modulation does not vary the gain of RF amplifier 80.

The feedback connection between terminals 60 and 61 to terminals 82 and 84, respectively, provide AGC operation by which, as the IF signal strength tends to increase, the gain of RF amplifier 80 is reduced, and vice versa. In such manner, the AGC system maintains the IF signal at a predetermined level even though the strength of the RF signal at the input to RF amplifier 80 may be changing.

In FIG. 1, the differential AGC signals are derived from the balanced audio output signals of the IF and demodulation stage 74, and applied to control the gain of the RF stage 80. However, the AGC signals may also be applied to control the gain of the IF stage as well. Such an arrangement is illustrated in FIG. 2.

Figure 2:
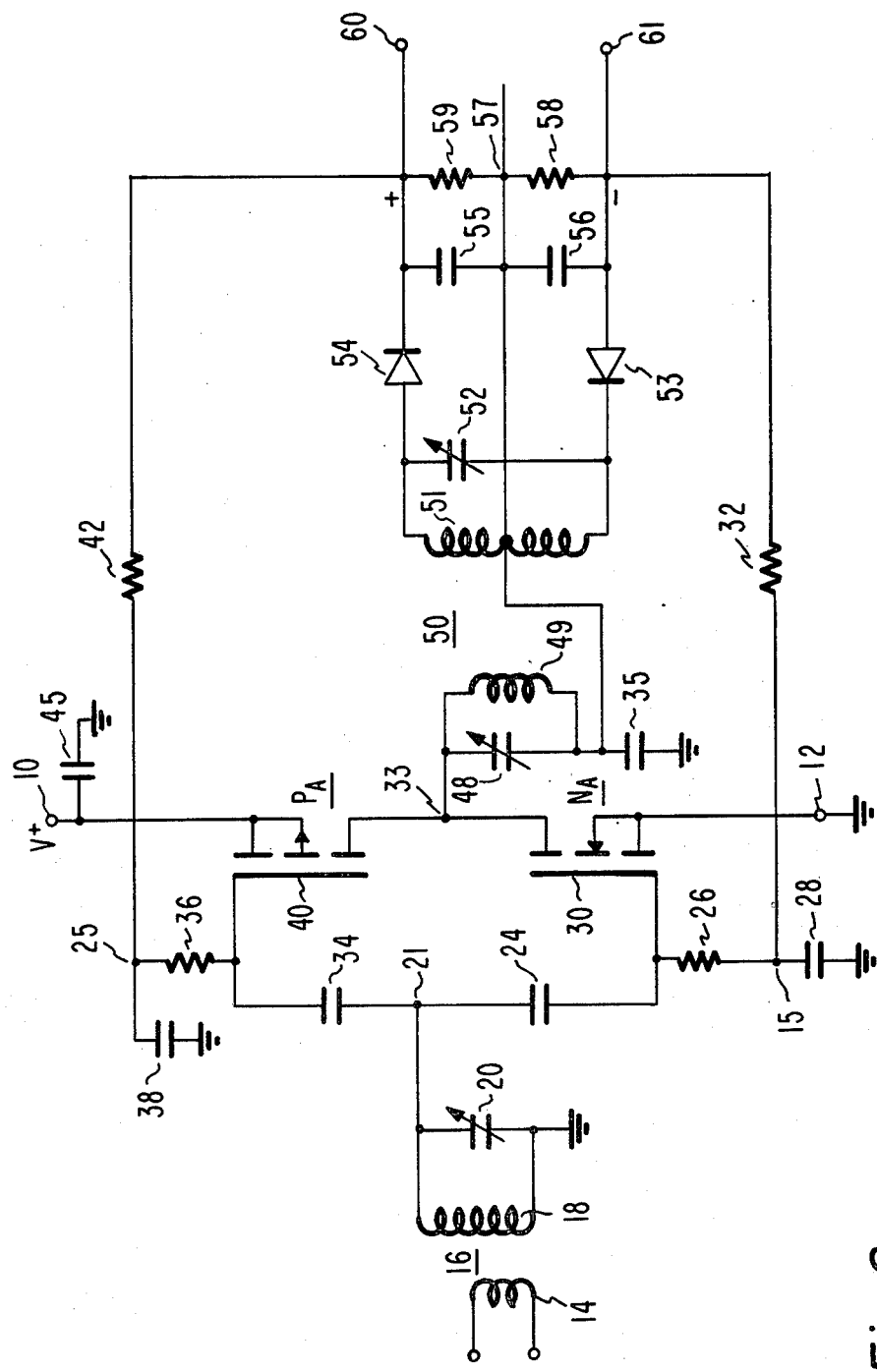
FIGS. 2, 3 and 4 are each schematic diagrams illustrating respective alternative embodiments of the present invention.

FIG. 2 shows a complementary symmetry amplifier comprising transistors $P_A$ and $P_B$, capacitors 24 and 34, input transformer 16, capacitor 20, output transformer 50 and capacitors 48 and 52. FIG. 2 further includes a balanced demodulator comprising two diodes 53, 54, two capacitors 55, 56 and two resistors 58, 59.

Respective operating and reference potentials, V+ and ground, are connected to the respective source electrodes of transistors $P_A$ and $P_B$. The drain electrodes of transistors $P_{A1}$ and $N_A$ are directly connected to node 33. Since the frequency of the IF signal is generally lower than that of the RF signal, a cascode circuit arrangement is not used in the IF amplifier of FIG. 2. Output transformer 50 includes a centertapped secondary winding 51 connected in parallel with tunable capacitor 52 to form a resonant circuit at the frequency of the IF signal.

In operation, assume that no IF signal is present. A quiescent operating point for transistor $P_A$ is established by a direct current connection of the drain electrode at node 33 through primary winding 49, resistors 59, 42 and 36 to the gate electrode 40. Similarly, a quiescent operating point for transistor $N_A$ is established by a direct current connection from the drain electrode at node 33 through primary winding 49, resistors 58, 32 and 26 to the gate electrode 30. Since transistor $P_{A1}$ and $N_A$ are assumed to have complementary conductivity characteristics, these drain-gate feedback paths establish the quiescent operating point of the amplifier V + /2, as required for Class A linear operation of transistors $P_A$ and $N_A$.

The IF amplifier of FIG. 2 further includes an AGC feedback circuit which tends to increase the gain of the stage when the received signal is weak and decrease the gain when the received signal is strong. On each positive-going half cycle of the IF signal across secondary winding 51, when the anode of diode 54 is positive with respect to its cathode, the diode 54 conducts current through resistor 59, charging RF filter capacitor 55 to an average value proportional to the peak value of the IF signal. The voltage drop across the resistor 59 is added to the V+/2 quiescent bias at node 57 so as to force the gate electrode 40 of transistor $P_A$ toward a more positive potential, thereby reducing its gate-to-source potential. The transconductance of transistor $P_A$ is thereby reduced and there is a corresponding reduction in the voltage gain of transistor $P_A$. On each negative-going half cycle of the IF frequency across secondary winding 51, when the cathode of diode 53 is negative with respect to its anode, the diode 53 conducts current through resistor 58, charging RF filter capacitor 56 to an average value proportional to the peak value of the IF signal. The voltage drop across resistor 58 is subtracted from the V+/2 quiescent bias at node 57 so as to force the gate electrode 30 of transistor $N_A$ toward a more negative potential, thereby reducing its gate-to-source potential. The transconductance of transistor $N_A$ is thereby reduced and there is a corresponding reduction in the voltage gain of the transistor $N_A$. By such feedback means, complementary gain reductions are made in the complementary transistors $P_A$ and $N_A$, and node 33 is maintained at an average value equal to V+/2.

When the amplitude of the IF signal increases, the voltage drop across resistors 48 and 59 increase and thereby automatically decrease the voltage gain of transistors $N_A$ and $P_A$ accordingly. When the amplitude of the IF signal decreaases, the AGC circuit acts in the reverse direction, applying less complementary gate-to-source bias potential to $P_A$ and $N_A$, thereby increasing their voltage gains so as to compensate for the reduction in the input signal amplitude.

Note that the AGC signals on terminals 60 and 61 are differential dc control signals, each representing the AC amplitude of the IF signal. In the embodiment shown, the dc value of each respective AGC signal represents the respective positive or negative peak value of the IF signal. Alternatively, the dc value of each respective AGC signal may represent the average root mean square (RMS) value, or other measure of AC amplitude, of the IF signal.

The signals developed at terminals 60 and 61 may be similarly used to control the gain of a plurality of other CMOS amplifier stages, as is illustrated for example by the cascode arrangement of FIG. 1. In such case, the signals provided on terminals 60 and 61 provide both the quiescent operating bias and the control voltage needed to automatically control the gain of the other CMOS amplifier stages.

Figure 3:
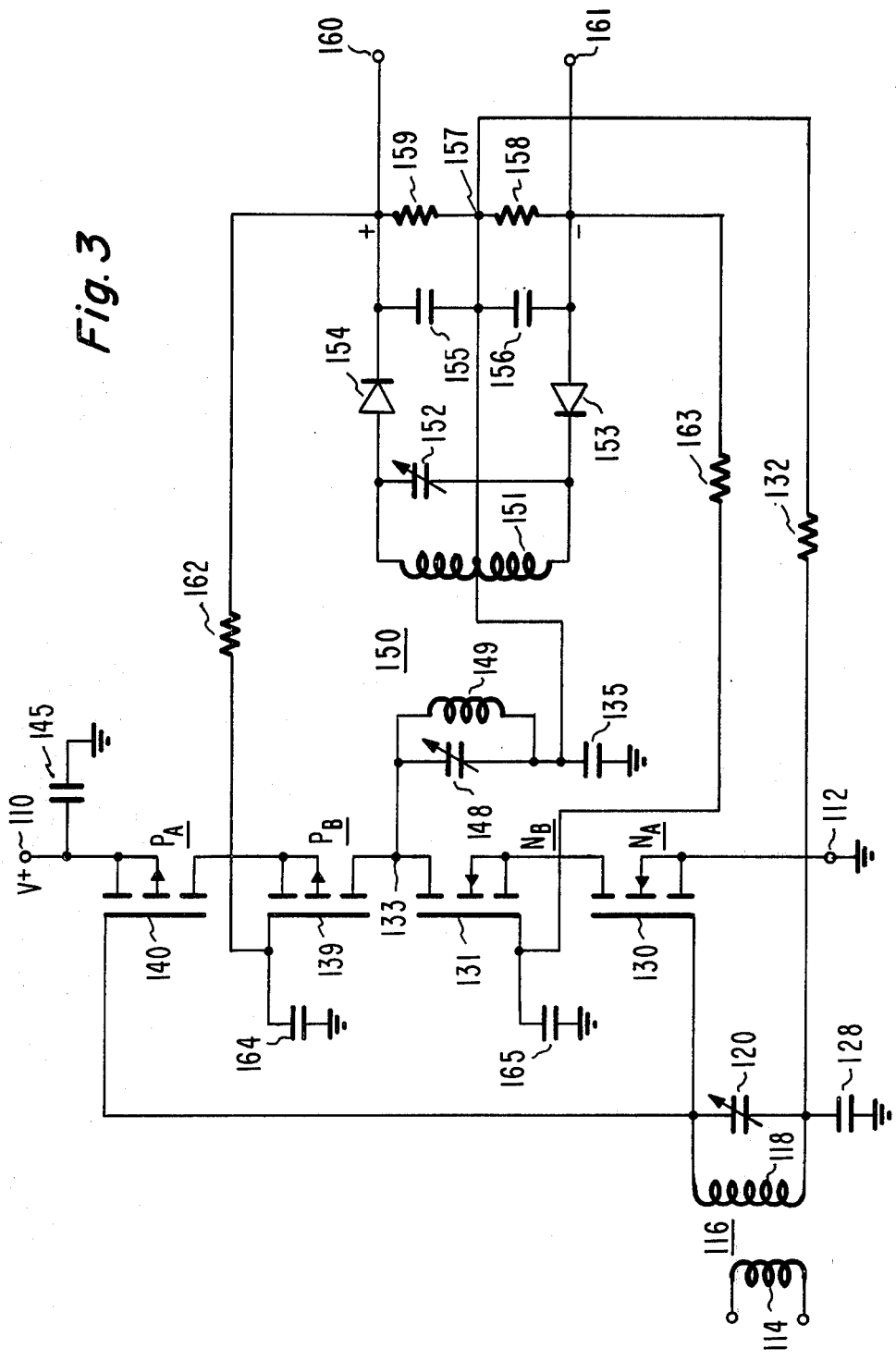

An alternative embodiment of the present invention using complementary cascoded MOS transistors is shown in FIG. 3. While the circuit of FIG. 1 shows a cascode arrangement having AGC control voltages applied to the "outer" common-source transistor pair, FIG. 3 shows a cascode circuit arrangement having AGC control voltages applied to the "inner" common-gate transistor pair. Common-source operated transistors $P_A$ and $N_A$ are arranged in a cascode configuration with transistors $P_B$ and $N_B$ which latter transistors are operated as common-gate amplifiers. The gate electrodes 130, 140 of transistors $P_A$ and $N_A$ are maintained at a quiescent bias of $V+/2$ by a direct current feedback path from gate electrodes 130, 140 through winding 118 of transformer 116, resistor 132, primary winding 149 of transformer 150, to node 133 at the interconnection of the drain electrodes of transistors $N_B$ and $P_B$. Capacitor 128 is a bypass capacitor providing a low impedance path at the frequency of the amplified signal.

The gate electrodes 130, 140 of the "outer" transistor pair, which are directly connected together, receive the input signal. The gate electrodes 139, 131 of the "inner" transistor pair, which are dc isolated from each other receive the AGC control voltages. Such arrangement avoid the need for input coupling capacitors.

Balanced differential audio output signal at terminals 160 and 161 provide gate bias and AGC signals to the gate electrodes 139, 131 of transistors $P_B$ and $N_B$, respectively. Two filters, resistor 162-capacitor 164, and resistor 163-capacitor 165, prevent the control voltages at the gate electrodes of $P_B$ and $N_B$, respectively, from varying at the audio modulation frequency.

Figure 4:
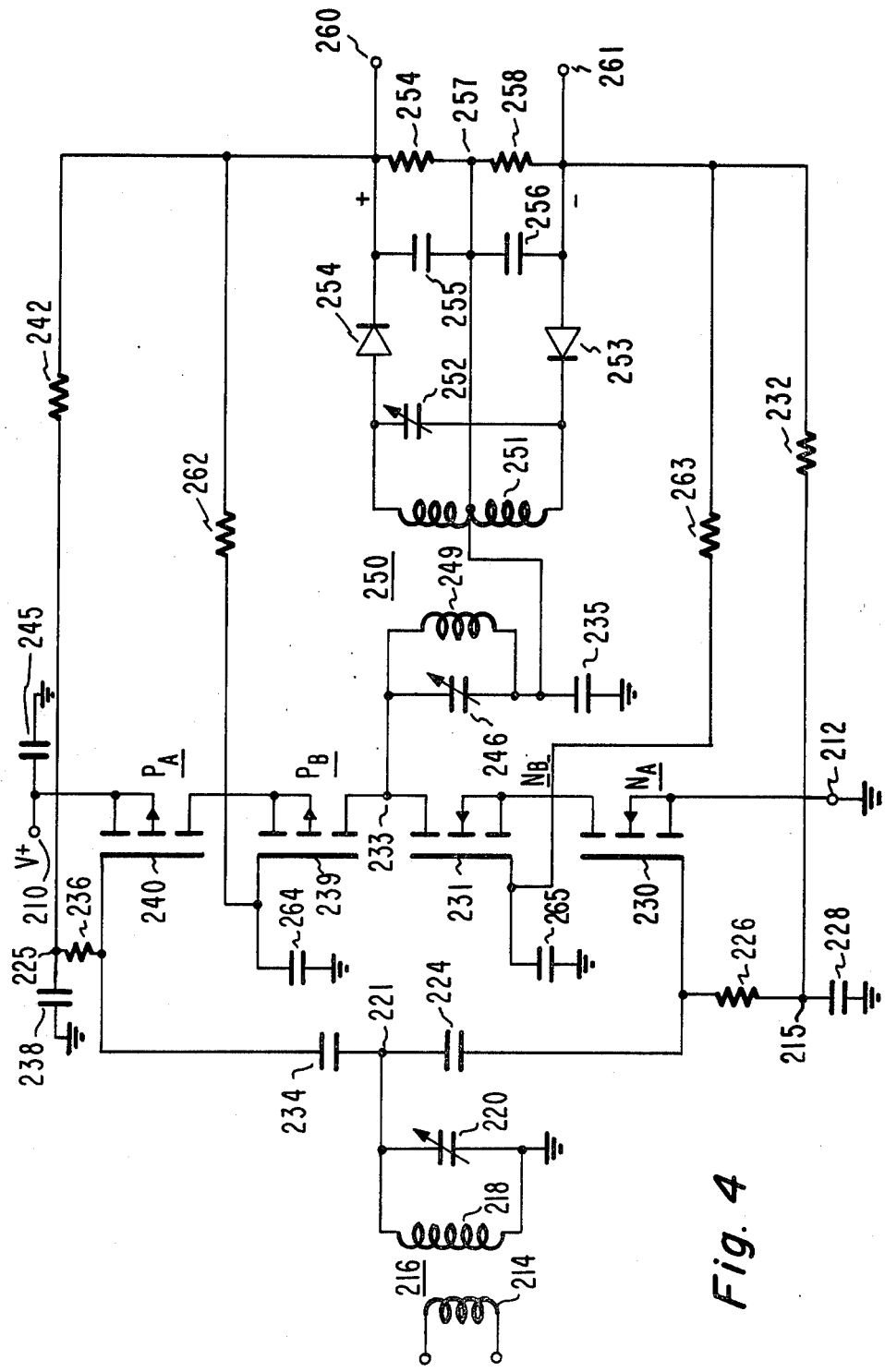

FIG. 4 illustrates yet another cascoded amplifier arrangement embodying the present invention. In the circuit of FIG. 4, AGC control signals are applied to the gate electrodes of both pairs of cascoded transistors $P_A$, $N_A$, $P_B$, $N_B$. Simultaneous application of AGC signals to all cascoded transistors provides improved circuit response to the AGC signals, which may be advantageously employed in applications requiring a high degree of AGC control. Terminal 260 provides gate bias potential and AGC signals for both of the N-channel transistors $N_A$, $N_B$ (via resistors 232, 226 and 263, respectively) and terminal 260 provides gate bias potential and AGC signals for both the P-channel transistors $P_A$, $P_B$ (via resistors 242, 236 and 262, respectively).

In the CMOS transistors $P_A$, $N_A$, $P_B$, $N_B$, each respective gate electrode is commonly made of a metal, such as aluminum. However, it should be understood that the term "CMOS" as used herein, includes complementary symmetry field effect transistors wherein the respective gate electrode thereof is made of a non-metallic material such as polysilicon. Similarly, the respective insulating layer between the gate electrode and the channel thereof, commonly made of silicon dioxide, may be any suitble insulating material. Furthermore, while embodiments of the present invention have been shown and described using enhancement mode field effect transistors, depletion mode field effect transistors may also be used in AGC circuits embodying the present invention.

What is claimed is:

1. An apparatus comprising:
   first and second field effect transistors of opposite conductivity type each having respective source, drain, and gate electrodes, said first and second field effect transistors being connected as a complementary symmetry field effect amplifier;
   means for applying an operating potential between said source electrodes of said first and second field effect transistors;
   input means for applying an input signal to said amplifier;
   output means connecting the respective drain electrodes of said first and second field effect transistors to an output terminal for developing an output signal at said output terminal;
   detector means responsive to said output signal for developing first and second balanced differential dc control signals each representing the AC amplitude of said output signal; and
   feedback means for applying said first and second balanced differential dc control signals to the respective gate electrodes of said first and second field effect transistors.

2. An apparatus in accordance with claim 1 wherein said input means comprises:
   an input terminal;
   a first capacitor connected between said input terminal and the gate electrode of said field effect transistor; and
   a second capacitor connected between said input terminal and the gate electrode of said second field effect transistor.

3. An apparatus according to claim 2 wherein said output means comprises third and fourth field effect transistors of opposite conductivity type each having respective source, drain, and gate electrodes, said first and third field effect transistors being of similar conductivity type, the source electrode of said third field effect transistor being connected to the drain electrode of said first field effect transistor, the source electrode of said fourth field effect transistor being connected to the drain electrode of said second field effect transistor, and the drain electrodes of said third and fourth field effect transistors being connected to said output terminal.

4. An apparatus according to claim 3 further including:
   second feedback means for applying said first and second differential dc control signals to the respective gate electrodes of said third and fourth field effect transistors.

5. An apparatus according to claim 1 wherein said means for applying an operating potential between the source electrodes of said first and second field effect transistors comprises:
   third and fourth field effect transistors of opposite cnductivity type each having respective source, drain, and gate electrodes, said first and third field effect transistors being of similar conductivity type, the source electrode of said first field effect transistor being connected to the drain electrode of said third field effect transistor, the source electrode of said second field effect transistor being connected to the drain electrode of said fourth field effect transistor and the respective source electrodes of said third and fourth transistors being arranged for receiving an operating potential therebetween.

6. An apparatus according to claim 5 wherein said input means comprises:
   an input terminal; and
   means for coupling said input terminal to the gate electrodes of said third and fourth field effect transistors.

7. The apparatus of claim 1 wherein said detector means includes a balanced demodulator responsive to said output signal for developing said first and second balanced differential control signals.

8. Apparatus comprising:
first and second supply terminals for receiving relatively positive and relatively negative operating potentials, respectively;
first and second p-channel field-effect transistors and first and second n-channel field-effect transistors each having a channel between its source and drain electrodes and each having a gate electrode,
a circuit point;
means connecting the channels of said first and second p-channel field-effect transistors in series between said first supply terminal and said circuit point;
means connecting the channels of said first and second n-channel field-effect transistors in series between said second supply terminal and said circuit point;
input means for coupling an input signal to the respective gate electrodes of said first n-channel and said first p-channel field-effect transistors;
output means for developing output signals from signals received from said circuit point including balanced detector means for developing first and second balanced differential control signals in response to the magnitude of said output signals;
feedback means for applying said first and second balanced differential control signals to the gate electrodes of said first n-channel and said first p-channel field-effect transistors, respectively, said first and second control signals being poled for reducing a gain of said first n-channel and said first p-channel field-effect transistors in response to an increase in the magnitude of said output signals; and
second means for applying first and second bias potentials to the gate electrodes of said second n-channel and said second p-channel field-effect transistors, respectively.

9. The apparatus of claim 8 wherein said second means for applying comprises means developing said first and second bias potentials in response to said first and second balanced differential control signals.

10. Apparatus comprising:
first and second supply terminals for receiving relatively positive and relatively negative operating potentials, respectively;
first and second p-channel field-effect transistors and first and second n-channel field-effect transistors, each having a channel between it source and drain electrodes and each having a gate electrode;
a circuit point;
means connecting the channels of said first and second p-channel field-effect transistors in series between said first supply terminal and said circuit point;
means connecting the channels of said first and second n-channel field-effect transistors in series between said second supply terminal and said circuit point;
input means for coupling an input signal to the respective gate electrodes of said first n-channel and said first p-channel field-effect transistors;
output means for developing output signals from signals received from said circuit point including balanced detector means for developing first and second balanced differential control signals in response to the magnitude of said output signals;
feedback means for applying said first and second balanced differential control signals to the gate electrodes of said second n-channel and said second p-channel field-effect transistors, respectively, said first and second control signals being poled for reducing a gain of said second n-channel and said second p-channel field-effect transistors in response to an increase in the magnitude of said output signals; and
second means for applying first and second bias potentials to the gate electrodes of said first n-channel and said first p-channel field-effect transistors, respectively.

11. The apparatus of claim 10 wherein said second means for applying comprises means developing said first and second bias potentials in response to said first and second balanced differential control signals.

* * * * *

UNITED STATES PATENT AND TRADEMARK OFFICE
CERTIFICATE OF CORRECTION

PATENT NO. : 4,353,036
DATED : October 5, 1982
INVENTOR(S) : Merle Vincent Hoover It is certified that error appears in the above-identified patent and that said Letters Patent is hereby corrected as shown below:

| | | |
|---|---|---|
| Column 2, line 47 | - | "transformers" should be --transformer--. |
| Column 3, line 24 | - | "respectivey" should be --respectively--. |
| Column 3, line 61 | - | "$P_{Al}$ and NA" should be --$P_A$ and $N_A$--. |
| Column 4, line 9 | - | "$P_{Al}$" should be --$P_A$--. |
| Column 5, line 59 | - | "suitble" should be --suitable--. |
| Claim 2, Column 6, line 24 | - | after "said" insert --first--. |
| Claim 5, Column 6, line 52 | - | "cnductivity" should be --conductivity--. |

Signed and Sealed this

Twenty-third Day of November 1982

[SEAL]

Attest:

GERALD J. MOSSINGHOFF

Attesting Officer    Commissioner of Patents and Trademarks